(12) United States Patent
Gerwig et al.

(10) Patent No.: US 11,936,376 B2
(45) Date of Patent: Mar. 19, 2024

(54) METHOD FOR OPERATING AN OPTOELECTRONIC TOUCH AND/OR OPERATING ELEMENT

(71) Applicant: Endress+Hauser SE+Co. KG, Maulburg (DE)

(72) Inventors: Simon Gerwig, Schopfheim (DE); Mike Frank, Lörrach (DE); Dirk Rapp, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 18/252,561

(22) PCT Filed: Sep. 23, 2021

(86) PCT No.: PCT/EP2021/076268
§ 371 (c)(1),
(2) Date: May 11, 2023

(87) PCT Pub. No.: WO2022/100918
PCT Pub. Date: May 19, 2022

(65) Prior Publication Data
US 2024/0022250 A1    Jan. 18, 2024

(30) Foreign Application Priority Data

Nov. 13, 2020 (DE) ...................... 10 2020 130 095.6

(51) Int. Cl.
*H03K 17/96* (2006.01)

(52) U.S. Cl.
CPC ................ *H03K 17/9629* (2013.01)

(58) Field of Classification Search
CPC .................................................. H03K 17/9629
See application file for complete search history.

(56) References Cited

U.S. PATENT DOCUMENTS

| 8,766,162 B2 * | 7/2014 | Tanase .................. G06F 3/0304 |
| | | 250/214 AL |
| 10,216,336 B2 * | 2/2019 | Philippe ............. H03K 17/9631 |
| 2010/0187406 A1 | 7/2010 | Van Dalen et al. |
| 2013/0182246 A1 | 7/2013 | Tanase |

FOREIGN PATENT DOCUMENTS

| DE | 102011081487 A1 | 2/2013 |
| DE | 102015003771 A1 | 9/2015 |
| EP | 2424113 A1 | 2/2012 |
| EP | 2955850 A1 | 12/2015 |

\* cited by examiner

*Primary Examiner* — Seung C Sohn
(74) *Attorney, Agent, or Firm* — Mark A. Logan; Endress+Hauser (USA) Holding, Inc.

(57) ABSTRACT

A method for operating at least one optoelectronic button or operating element arranged behind an optically transparent control panel of a field device of automation technology for detecting an actuation of the optoelectronic button or operating element by an operator of the field device includes detecting whether the field device of automation technology is located in an interior area or in an exterior area; defining an evaluation condition which is used to detect the actuation of the optical button or control element; and detecting or evaluating whether an actuation of the optoelectronic button or control element is present based on the defined evaluation condition.

13 Claims, 2 Drawing Sheets

METHOD FOR OPERATING AN OPTOELECTRONIC TOUCH AND/OR OPERATING ELEMENT

CROSS-REFERENCE TO RELATED APPLICATIONS

The present application is related to and claims the priority benefit of German Patent Application No. 10 2020 130 095.6, filed on Nov. 13, 2020, and International Patent Application No. PCT/EP2021/076268, filed Sep. 23, 2021, the entire contents of which are incorporated herein by reference.

TECHNICAL FIELD

The invention relates to a method for operating at least one optoelectronic button or control element arranged behind an optically transparent control panel of a field device of automation technology, for detecting an actuation of the optoelectronic button or control element by an operator of the field device.

BACKGROUND

Field devices for recording and/or influencing process variables are often used in process technology as well as in automation technology. Measuring devices, such as level measuring devices, flow meters, pressure and temperature measuring devices, pH meters, conductivity meters etc., are used for recording process variables and record the corresponding process variables for level, flow, pressure, temperature, pH and conductivity. Actuators, such as valves or pumps, by which, for example, the flow rate of a liquid in a pipe or the fill level of a medium in a container is changed, are used to influence the process variables. In principle, all devices that are used in-process and that supply or process process-relevant information are referred to as field devices.

An optoelectronic control element can be used as a replacement for mechanically operated buttons, switches, levers, and other control elements. However, due to the large number of intended purposes of the field devices, it is difficult to enable reliable detection of a "button push" on such an optoelectronic control element. Moreover, this is also made more difficult in that the control panel can be made of different materials. For example, glass control panels can be used for use in a potentially explosive atmosphere, whereas plastic control panels are used in field devices which are not designed for use in a potentially explosive atmosphere. Since the control panels are usually embedded in the field device cover and the cover in field devices can also be replaced, it cannot necessarily be assumed that one and the same cover remains during the entire life cycle. The reliable detection of a "button push" can also be made more difficult by environmental influences or environmental conditions, such as the intensity of solar radiation, or also by scratches, contamination.

The invention is thus based on the object of enabling reliable detection of a "button push" in the case of an optoelectronic control element behind a control panel of a field device of automation technology.

SUMMARY

The object is achieved according to the invention by the method according to claim 1 and the field device of automation technology according to claim 13.

The method according to the invention for operating at least one optoelectronic button or operating element arranged behind an optically transparent control panel of a field device of automation technology, for detecting an actuation of the optoelectronic button or operating element by an operator of the field device, provides for the following method steps:
  a.) detecting whether the field device of automation technology is located in an interior area or in an exterior area;
  b.) defining an evaluation condition which is used to detect the actuation of the optical button or control element, wherein a first evaluation condition is used in the event that it is detected that the field device is located in an interior area, and a second evaluation condition different from the first is used in the event that it is detected that the field device is located in an exterior area;
  c.) detecting or evaluating whether an actuation of the optoelectronic button or control element is present based on the defined evaluation condition, wherein in the first evaluation condition, a value dependent on the time profile of an output signal originating from the optoelectronic button or control element is set in relation to a current value of the output signal for detecting the actuation of the optoelectronic button or control element, and in the second evaluation condition, a value independent of the time profile of the output signal, in particular, during measuring operation of the field device, is set in relation to a current value of the output signal for detecting the actuation of the optoelectronic button or control element.

An advantageous embodiment of the method according to the invention provides that, for detecting an actuation of the optoelectronic button or control element based on the first evaluation condition, an actuation is detected if the current value of the output signal is greater than a value representing the time profile of the output signal.

A further advantageous embodiment of the method according to the invention provides that, in the second evaluation condition, a value representing an environmental condition, in particular, a value representing an electromagnetic ambient radiation, is furthermore set in relation to a current value of the output signal. Especially, the embodiment can provide that for detecting an actuation of the optoelectronic button or control element, an actuation is detected based on the second evaluation condition if a difference between the current value of the output signal and the value representing the environmental condition is greater than the value independent of the time profile of the output signal.

A further advantageous embodiment of the method according to the invention provides that, before the detection or evaluation as to whether an actuation of the optoelectronic button or control element is present, it is first ascertained from which material the control panel is formed, and the detection or evaluation as to whether an actuation of the optoelectronic button or control element takes place as a function of the material of the control panel. Especially, the embodiment can provide that, as a function of the ascertained material of the control panel, a value dependent on the control panel material is used in the detection or evaluation as to whether an actuation of the optoelectronic button or control element.

A further advantageous embodiment of the method according to the invention provides that a comparison value is used as the value independent of the time profile of the output signal, which comparison value is recorded and stored, preferably individually for each optoelectronic button or control element, during the production or manufacture of the field device. For this purpose, a replica of a field device cover comprising a plastic or glass can be used during manufacture, for example.

A further advantageous embodiment of the method according to the invention provides that the comparison value serving as the value independent of the time profile of the output signal is adjusted during the measuring operation of the field device. Especially, the embodiment provides that the adjustment is carried out in such a way that it is first ascertained during the measuring operation of the field device whether a state that permits an adjustment is given, and the adjustment is carried out only if such a state is given.

A further advantageous embodiment of the method according to the invention provides that, for ascertaining as to whether a state that permits an adjustment is given, the value representing the environmental condition, in particular, the value representing the electromagnetic ambient radiation, is used.

A further advantageous embodiment of the method according to the invention provides that, in the event that a state that permits an adjustment is given, the comparison value is adjusted to a current value of the output signal or a value representing the time profile of the output signal originating from the optoelectronic button or control element.

The invention furthermore relates to a field device of automation technology, at least having:
  a control panel which is preferably transparent and has a contact surface for actuation by a user on an outer side of a housing of the field device;
  at least one optoelectronic button or control element, which is arranged on an inner side of the control panel and has at least one transmitting unit, which is arranged on an inner side of the control panel facing away from the outer side and is designed to transmit an optical signal in the direction of the control panel, and has at least one receiving unit corresponding to the at least one transmitting unit, for receiving the optical signal, wherein the receiving unit is arranged on the inner side of the control panel in such a way that an optical signal scattered at the control panel by a finger of the user or at another scattering object at least partially reaches the at least one receiving unit, wherein the optoelectronic button or control element is furthermore configured to detect the intensity of the optical signal incident on the receiving unit, on the basis of the received optical signal and to provide an output signal dependent thereon;
  an evaluation unit configured to perform at least method steps b) and c) according to the method according to the invention.

An advantageous embodiment of the field device according to the invention furthermore provides a light sensor or photodetector, which is configured to output a signal representing an environmental condition, in particular, a signal representing an electromagnetic ambient radiation, and wherein the evaluation unit is furthermore configured to set the value representing the environmental condition in relation to a current value of the output signal of the optoelectronic button or control element on the basis of the signal.

BRIEF DESCRIPTION OF THE DRAWINGS

The invention is explained in more detail on the basis of the following drawings. In the figures.

DETAILED DESCRIPTION

Figure 1:
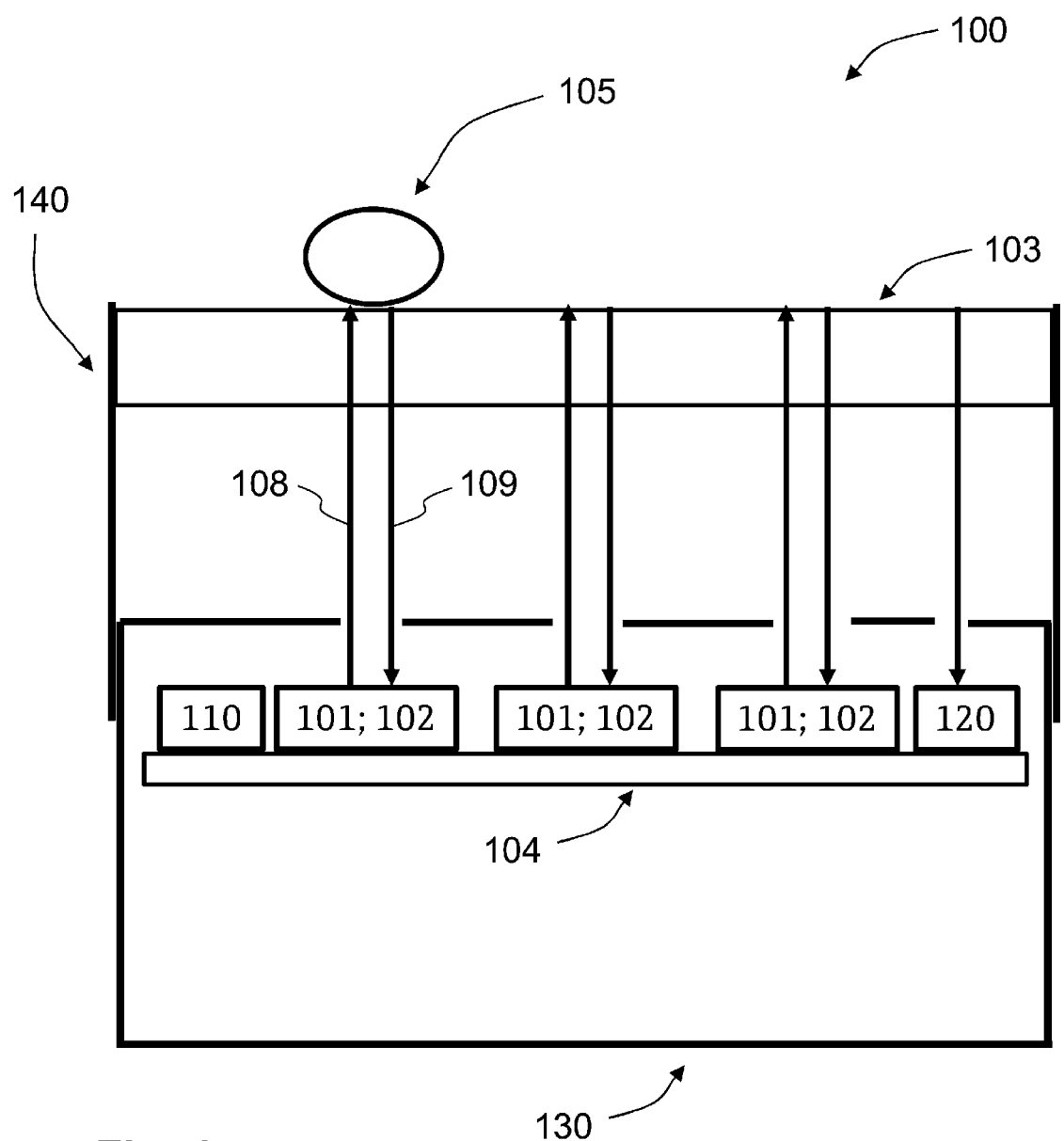
FIG. 1 shows a schematic, greatly simplified view of a field device of automation technology.

FIG. 1 shows a schematic and greatly simplified view of a field device of automation technology. The field device consists of a field device housing 130 and a field device cover 140 fastened thereto. The cover 140 is usually fastened to the housing 130 by screwing the cover onto the housing. In a partial region, the cover has an optically transparent control panel 103 which enables the operation of an optoelectronic button or control element 101, 102 located behind it, by touching the control panel 103 by means of a finger.

Depending on the intended use of the field device 100, the field device cover 140 and/or the control panel 103 is made of a different material. For use in a potentially explosive atmosphere, for example, the control panel 103 is made of glass, whereas when used outside a potentially explosive atmosphere, the control panel 103 may also be manufactured from a transparent plastic.

In order to detect an actuation of the optoelectronic button or control element ("button push"), the control panel 103 can be optically scanned from the inner side by the optoelectronic button or control element. For optically scanning the control panel 103, at least one optoelectronic button or control element is provided on the inner side of the control panel 103 and consists of at least one transmitting unit 101, for example in the form of an infrared diode, and one receiving unit 102, for example in the form of a photodiode.

The invention is not limited to a single optoelectronic button or control element. Usually, a row of optoelectronic button or control elements is used to implement multiple buttons. For example, three optoelectronic button or control elements arranged in a row can be used to implement a 3-button control element. The optoelectronic button or control elements each have a transmitting unit 101 configured for transmitting an optical signal and a receiving unit 102 configured for receiving the optical signal.

The transmitting unit 101 for transmitting the optical signal can, for example, be configured to transmit an optical signal in the infrared spectral range. This can be implemented, for example, by a light-emitting diode or a laser diode.

The receiving unit 102 for receiving the optical signal can, for example, have an infrared receiving diode, preferably a PIN diode, and an A/D converter, which digitizes a PIN diode current originating from the receiving diode, for further processing. The receiving unit 102 is arranged within a radiation region which is defined by the light 109 emitted by the transmitting unit 101 and scattered diffusely at the control panel 103 when a finger is applied.

Both the transmitting unit 101 and the receiving unit 102 can be arranged on a printed circuit board 104. The receiving unit 102 is arranged on the control panel 103 in such a way that in the event that a finger 105 of a user or another scattering object touches the control panel 103 in the operator panel region or at least comes very close thereto, the scattered optical signal 109 at least partially reaches the receiving unit 102.

The transmitting unit and the receiving unit 101, 102 together form a first transmitting/receiving pair with the aid of which a first operator panel region can be scanned so that a first optical button is produced. The optoelectronic control element may also have multiple optical buttons, which are arranged next to one another and/or one above the other in the form of an operator panel. Each optical button is formed by a respective further transmitting/receiving pair, which scans the corresponding further control panel. Thus, the optoelectronic control element can have a plurality of transmitting/receiving units, which operate in principle analogously to the previously described transmitting/receiving pair.

If the user touches, with the finger 105, the control panel 103 above the transmitting unit 101 in the operator panel region provided for this purpose, the optical signal 108 emitted by the transmitting unit 101 is diffusely scattered at the finger 105. In this case, the finger 105 acts as a scattering body. When the control panel 103 is touched at the corresponding location, a portion of the optical signal 108 emitted by the transmitting unit 101 reaches the receiving unit 102. This is represented by the arrow 109 in FIG. 1. The receiving unit 102 detects the intensity of the optical signal incident on it and generates an output signal dependent thereon.

Furthermore, the field device has an evaluation unit 110, which may also be located on the printed circuit board 104, for example. However, the evaluation unit may also be designed as a part of the optoelectronic button or control element, i.e., be integrated therein.

In addition, the field device can have a light sensor or photodetector 120, which is configured to output a signal representing an environmental condition, in particular, a signal representing an electromagnetic ambient radiation, so that an intensity of the ambient light can be detected.

Figure 2:
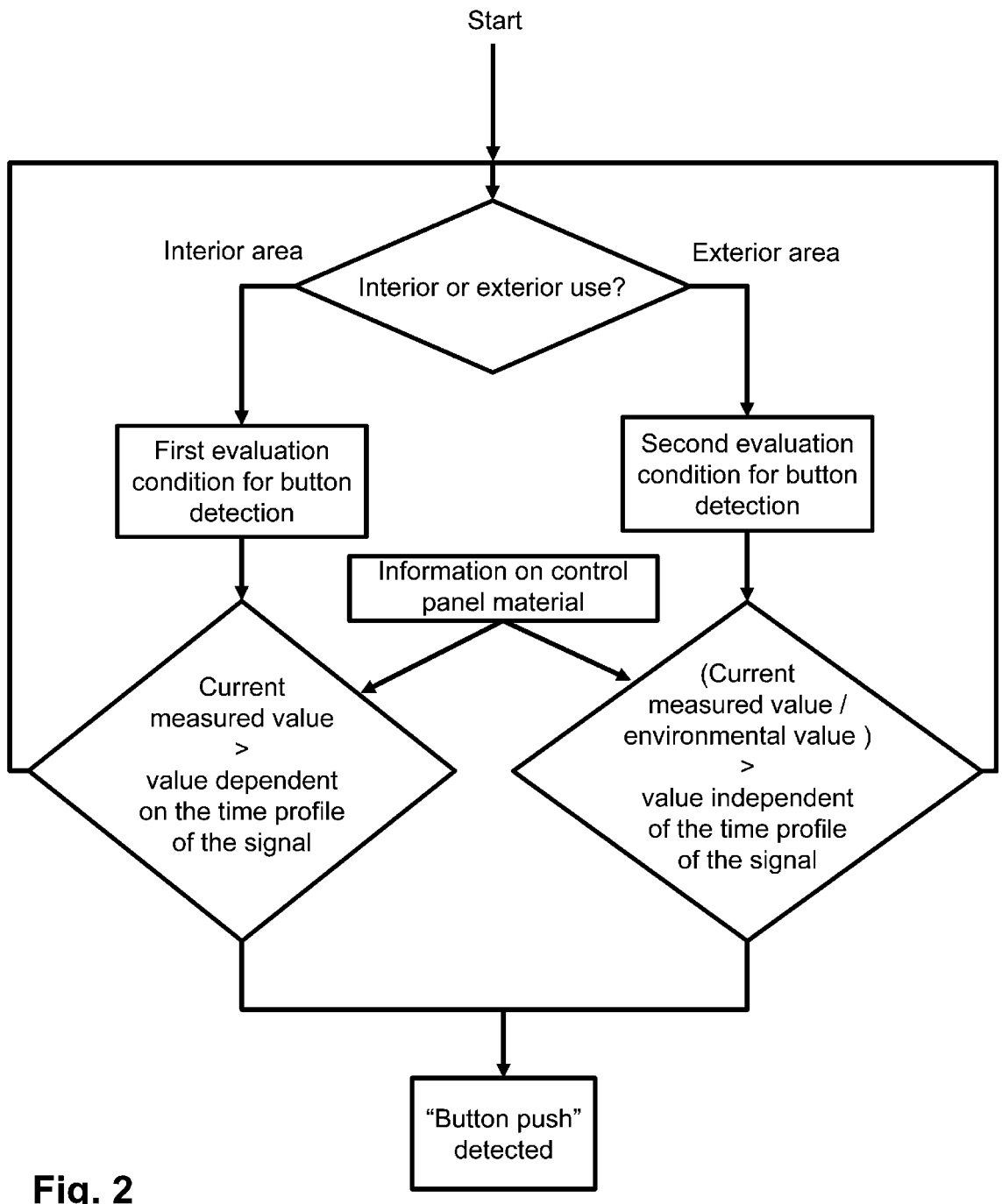
FIG. 2 shows a flow chart of the method according to the invention.

The evaluation unit is configured to perform the method according to the invention. FIG. 2 shows a flow chart of the method for clarification.

In a first method step, it is detected whether the field device of automation technology is located in an interior area or in an exterior area of automation technology. For this purpose, the evaluation unit 110 can resort to the signal originating from the photodetector 120 and representing the environmental condition. For example, when a value of the signal is exceeded, the evaluation unit can determine that the field device is located in an exterior area.

In a second method step, an evaluation condition which is used to detect the actuation of the optical button or control element can be defined by the evaluation unit 110 as a function of where the field device 100 is located. In the event that it has been detected that the field device 100 is located in an interior area, the evaluation unit 110 can be configured to use a first evaluation condition, and in the event that it has been detected that the field device is located in an exterior area, the evaluation unit 110 can be configured to use a second evaluation condition different from the first evaluation condition, for detecting a "button push."

In a third optional method step, it can be ascertained from which material the control panel 103 is formed. This can take place, for example, by resorting to information regarding the material of the control panel 103. The information regarding the material can be stored, for example, in a non-volatile memory arranged in the field device housing 130 or the field device cover 140. The information can, for example, be stored by the field device manufacturer during the manufacture of the field device 100 so that it can be queried as needed, for example by the evaluation unit 110.

In a fourth method step, the evaluation unit 110 detects or evaluates whether an actuation of the optoelectronic button or control element 101, 102 is present, based on the evaluation condition defined in the second method step.

For this purpose, a value dependent on the time profile of the output signal originating from the optoelectronic button or control element is set in relation to a current value of the output signal in the first evaluation condition. For example, a mean value can be formed from the values of the time profile of the output signal originating from the optoelectronic button or control element 101, 102. Alternatively, a moving average can also be formed from the values of the time profile of the output signal originating from the optoelectronic button or control element. According to the second evaluation condition, this value is subsequently compared to a current value of the output signal, and in the event that the current value of the output signal is greater than or even greater than or equal to the value representing the time profile, a "button push" is detected, and in the event that the current value of the output signal is lower, no "button push" is detected.

On the other hand, in the second evaluation condition, a value independent of the time profile of the output signal, in particular, during the actual measuring operation of the field device, is set in relation to a current value of the output signal for detecting the "button push." For example, a comparison value which is generated during the manufacture or production of the field device at the field device manufacturer can serve as the value independent of the time profile of the output signal. For example, such a value may have been generated individually for each optoelectronic button or control element. In order to be able to access, during the measuring operation, the comparison value(s) generated during the manufacture or production, said value(s) can be stored in a non-volatile memory of the field device.

In addition, it may be provided that the comparison value not generated during the actual measuring operation is adjusted, i.e., changed, during the actual measuring operation. In this case, for example, the evaluation unit can be configured to first check during the actual measuring operation whether a state that permits an adjustment of the comparison value is currently given. This can take place using the signal representing the environmental condition, in particular, the signal representing the electromagnetic ambient radiation. For example, it can be ascertained, via the time profile of the signal, whether no change in the environment, e.g., from bright too dark or also from day to night, is currently taking place, in order to thus determine a state or time period suitable for adjusting the comparison value. Especially time periods in which a low ambient radiation is present, i.e., for example during the night, are suitable for adjusting the comparison value. For example, if a change of the signal over a defined time period is not greater than a specifiable maximum value, a state that permits an adjustment can be detected. The defined time period can, for example, be greater than 60 minutes, in particular, greater than 120 minutes. After a state that permits an adjustment has been ascertained, the actual adjustment of the comparison value is subsequently carried out. For this purpose, the comparison value is adjusted to a current value of the output signal. Alternatively, multiple values of the time profile of the output signal can also be combined to form a value representing the time profile. For example, a mean value formation over multiple values of the output signal can be formed and the comparison value can be adjusted to this value. Furthermore, it may be provided that the adjustment of the comparison value takes place only in a predetermined range, i.e., the comparison value can be adjusted only plus/minus a specified comparison value range and not beyond it. Such an adjustment offers the advantage that, example, aging of the optoelectronic button or control element and/or changes to the control panel, e.g., scratches or the like, can be compensated to a certain extent.

The invention claimed is:

1. A method for operating at least one optoelectronic button or operating element arranged behind an optically transparent control panel of a field device of automation technology, for detecting an actuation of the optoelectronic button or operating element by an operator of the field device, the method comprising:
   detecting whether the field device is located in an interior area or in an exterior area;
   defining a first evaluation condition and a second evaluation condition which are used to detect the actuation of the optical button or control element, wherein the first evaluation condition is used when it is detected that the field device is located in an interior area, and the second evaluation condition different from the first is used when it is detected that the field device is located in an exterior area;
   detecting or evaluating whether an actuation of the optoelectronic button or control element is present based on the first evaluation condition or on the second evaluation condition, wherein in the first evaluation condition, a value dependent on a time profile of an output signal originating from the optoelectronic button or control element is set in relation to a current value of the output signal for detecting the actuation of the optoelectronic button or control element, and in the second evaluation condition, a value independent of the time profile of the output signal during measuring operation of the field device is set in relation to a current value of the output signal for detecting the actuation of the optoelectronic button or control element.

2. The method according to claim 1, wherein for detecting an actuation of the optoelectronic button or control element based on the first evaluation condition, an actuation is detected when the current value of the output signal is greater than a value representing the time profile of the output signal.

3. The method according to claim 1, wherein in the second evaluation condition, a value representing an electromagnetic ambient radiation is furthermore set in relation to a current value of the output signal.

4. The method according to claim 3, wherein for detecting an actuation of the optoelectronic button or control element, an actuation is detected based on the second evaluation condition when a difference between the current value of the output signal and the value representing the electromagnetic ambient radiation is greater than the value independent of the time profile of the output signal.

5. The method according to claim 1, further comprising:
   ascertaining from which material the control panel is formed,
   wherein the detection or evaluation of the actuation of the optoelectronic button or control element is a function of the material of the control panel.

6. The method according to claim 5, wherein, as a function of the ascertained material of the control panel, a value dependent on the control panel material is used in the detection or evaluation of the actuation of the optoelectronic button or control element.

7. The method according to claim 3, wherein, as the value independent of the time profile of the output signal, a comparison value is used that is recorded and stored for each optoelectronic button or control element during the production or manufacture of the field device.

8. The method according to claim 7, wherein the comparison value serving as the value independent of the time profile of the output signal is adjusted during the measuring operation of the field device.

9. The method according to claim 8, wherein the adjustment is carried out in such a way that it is first ascertained during the measuring operation of the field device whether a state that permits an adjustment is given, and the adjusting is carried out only if such a state is given.

10. The method according to claim 9, wherein for ascertaining whether the state that permits the adjustment is given, the value representing the electromagnetic ambient radiation is used.

11. The method according to claim 10, wherein in the event that the state that permits an adjustment is given, the comparison value is adjusted to a current value of the output signal or a value representing the time profile of the output signal originating from the optoelectronic button or control element.

12. A field device of automation technology, comprising:
   a transparent control panel having a contact surface for actuation by a user on an outer side of a field device housing or a field device cover;
   at least one optoelectronic button or control element that is arranged on an inner side of the transparent control panel, the optoelectronic button or control element including:
      at least one transmitting unit arranged on the inner side of the transparent control panel facing away from the outer side, wherein the at least one transmitting unit is designed to transmit an optical signal in a direction of the control panel; and
      at least one receiving unit corresponding to the at least one transmitting unit, wherein the at least one receiving unit is configured to receive the optical signal, and wherein the at least one receiving unit is arranged on the inner side of the control panel such that the optical signal scattered at the control panel by a finger or at another scattering object at least partially reaches the at least one receiving unit),
   wherein the at least one optoelectronic button or control element is configured to detect the intensity of the optical signal incident on the receiving unit on the basis of the received optical signal and to provide an output signal dependent thereon;
   an evaluation unit configured to:
      define a first evaluation condition and a second evaluation condition which are used to detect the actuation of the at least one optical button or control element, wherein the first evaluation condition is used when it is detected that the field device is located in an interior area, and the second evaluation condition different from the first is used when it is detected that the field device is located in an exterior area; and
      detect or evaluate whether an actuation of the at least one optoelectronic button or control element is present based on the first evaluation condition or on the second evaluation condition, wherein in the first evaluation condition, a value dependent on a time profile of an output signal originating from the at least one optoelectronic button or control element is set in relation to a current value of the output signal for detecting the actuation of the at least one optoelectronic button or control element, and in the second evaluation condition, a value independent of the time profile of the output signal during measuring operation of the field device is set in relation to a current value of the output signal for detecting the actuation of the at least one optoelectronic button or control element.

13. The field device according to claim 12, further comprising:
a light sensor or photodetector configured to output a signal representing an electromagnetic ambient radiation,
wherein the evaluation unit is further configured to set a value representing and environmental condition in relation to a current value of the output signal of the optoelectronic button or control element on the basis of the signal.

* * * * *